United States Patent [19]

Shirai

[11] Patent Number: 5,293,332

[45] Date of Patent: Mar. 8, 1994

[54] SEMICONDUCTOR MEMORY DEVICE WITH SWITCHABLE SENSE AMPS

[75] Inventor: Takayuki Shirai, Tokyo, Japan

[73] Assignee: NEC Corporation, Tokyo, Japan

[21] Appl. No.: 95,195

[22] Filed: Jul. 23, 1993

[30] Foreign Application Priority Data

Jul. 29, 1992 [JP] Japan .................................. 4-201684

[51] Int. Cl.$^5$ .............................................. G11C 7/06
[52] U.S. Cl. .................................. 365/189.02; 365/205;
365/230.03; 365/230.06; 365/230.09; 365/235;
365/239
[58] Field of Search .............. 365/205, 230.03, 230.06,
365/230.09, 235, 239, 189.02

[56] References Cited

U.S. PATENT DOCUMENTS

| | | | |
|---|---|---|---|
| 4,903,235 | 2/1990 | Kubuta et al. | 365/205 |
| 4,931,994 | 6/1990 | Matsui et al. | 365/205 |
| 5,016,226 | 5/1991 | Hiwada et al. | 365/230.03 |
| 5,220,518 | 6/1993 | Haq | 365/230.06 |
| 5,243,574 | 9/1993 | Ikeda | 365/205 |

Primary Examiner—Joseph E. Clawson, Jr.
Attorney, Agent, or Firm—Sughrue, Mion, Zinn, Macpeak & Seas

[57] ABSTRACT

A semiconductor memory device, in which based on a write and non-write states of a memory transistor, a signal corresponding to a page mode and a normal mode is generated, and a switch circuit activates all sense amplifiers corresponding to memory array blocks and transfers data read out of the memory array blocks to the sense amplifiers in the page mode and also activates one of the sense amplifiers and successively transfers the data read out of the memory cell array blocks to the one activated sense amplifier according to an address signal in the normal mode. A plurality of sense amplifiers are activated in the page mode and the minimum number of the sense amplifiers is activated in the normal mode to eliminate a waste of a consumption power.

3 Claims, 3 Drawing Sheets

SEMICONDUCTOR MEMORY DEVICE WITH SWITCHABLE SENSE AMPS

BACKGROUND OF THE INVENTION

The present invention relates to a semiconductor memory device having a page read mode.

DESCRIPTION OF THE RELATED ARTS

In FIG. 1, there is shown a conventional semiconductor memory device which is comprised of a memory cell array section 1 having a plurality of memory cell array blocks 11 (in this case, four memory cell array blocks 11), a row decoder 2 connected to the memory cell array section 1, a column selector 4 connected to the memory cell array section 1, a column decoder 3 coupled with the column selector 4, a reference memory cell 5 for storing reference data, a plurality of sense amplifiers SA1, SA2, SA3 and SA4 (in this case, four sense amplifiers corresponding to the memory cell array blocks 11) connected to the column selector 4 and the reference memory cell 5, an output circuit 7a connected to the sense amplifiers SA1, SA2, SA3 and SA4, and an output decoder 6a coupled with the output circuit 7a.

A row address signal ADr and a column address signal ADc are input to the row decoder 2 and column decoder 3, respectively, and by the row decoder 2, the column decoder 3 and the column selector 4, data are read out of the memory cell array blocks 11 from addresses selected by the row address signal ADr and the column address signal ADc. A sense activation signal SAE for activating the sense amplifiers SA1, SA2, SA3 and SA4 is input to the sense amplifiers SA1, SA2, SA3 and SA4. The sense amplifiers SA1, SA2, SA3 and SA4 compare the data read out of the memory cell array blocks 11 with the reference data output from the reference memory cell 5 and detect comparison data levels to output the data levels to the output circuit 7a. A selection address signal ADs composed of lower order two bits of an address signal is input to the output decoder 6a and the output decoder 6a allows the output circuit 7a to select one of the output data fed from the sense amplifiers SA1, SA2, SA3 and SA4 to output the selected output data DTo.

In this case, in a normal mode, every one address, the row address signal ADr, the column address signal ADc and the selection address signal ADs are renewed, but in a page mode, as shown in FIG. 2 with respect to a pair of row and column address signals ADr and ADc, the selection address signal ADs consecutively assigns proper addresses. For example, assuming that the selection address signal ADs is composed of the lower order two bits (A0, A1) of the address signal, as described above, signals with four addresses are successively output. As a result, a high speed reading can be carried out in comparison with the normal mode.

In this conventional semiconductor memory device, in the normal mode, though the effective data at one access is the output of only one sense amplifier, all the sense amplifiers SA1, SA2, SA3 and SA4 are activated and thus useless power is consumed.

SUMMARY OF THE INVENTION

Accordingly, it is an object of the present invention to provide a semiconductor memory device in view of the aforementioned defects of the prior art, which is capable of eliminating a waste of consumption power.

In accordance with one aspect of the present invention, there is provided a semiconductor memory device, comprising memory cell array means having a plurality of memory cell array blocks to be read out data from addresses selected by a first address signal; a plurality of sense amplifiers corresponding to the memory cell array blocks, the sense amplifiers detecting levels of data transferred from the memory cell array blocks when the sense amplifiers are activated, to output the detected levels; a switch circuit for activating one of the sense amplifiers and successively transferring the data read out of the memory cell array blocks to the one activated sense amplifier according to a second address signal in a normal mode and for activating all the sense amplifiers and transferring the data read out of the memory cell array blocks to the corresponding sense amplifiers in a page mode; and an output circuit for outputting the data of the one activated sense amplifier in the normal mode and successively outputting the data of the plurality of sense amplifiers according to the second address signal in the page mode.

The switch circuit includes a switch signal generating circuit having a memory transistor for generating a first switch signal having levels corresponding to the normal mode and the page mode in response to a write state and a non-write state of the memory transistor; a decoder for successively making active levels of a second switch signal corresponding to the plurality of memory cell array blocks according to the second address signal when the first switch signal has a normal mode level; and a switch controller for controlling a switching of the connection between the memory cell array blocks and the sense amplifiers according to the first and second switch signals and controlling an activation and an inactivation of the sense amplifiers.

BRIEF DESCRIPTION OF THE DRAWINGS

The objects, features and advantages of the present invention will become more apparent from the consideration of the following detailed description taken in conjunction with the accompanying drawings in which.

DESCRIPTION OF THE PREFERRED EMBODIMENTS

Figure 1:
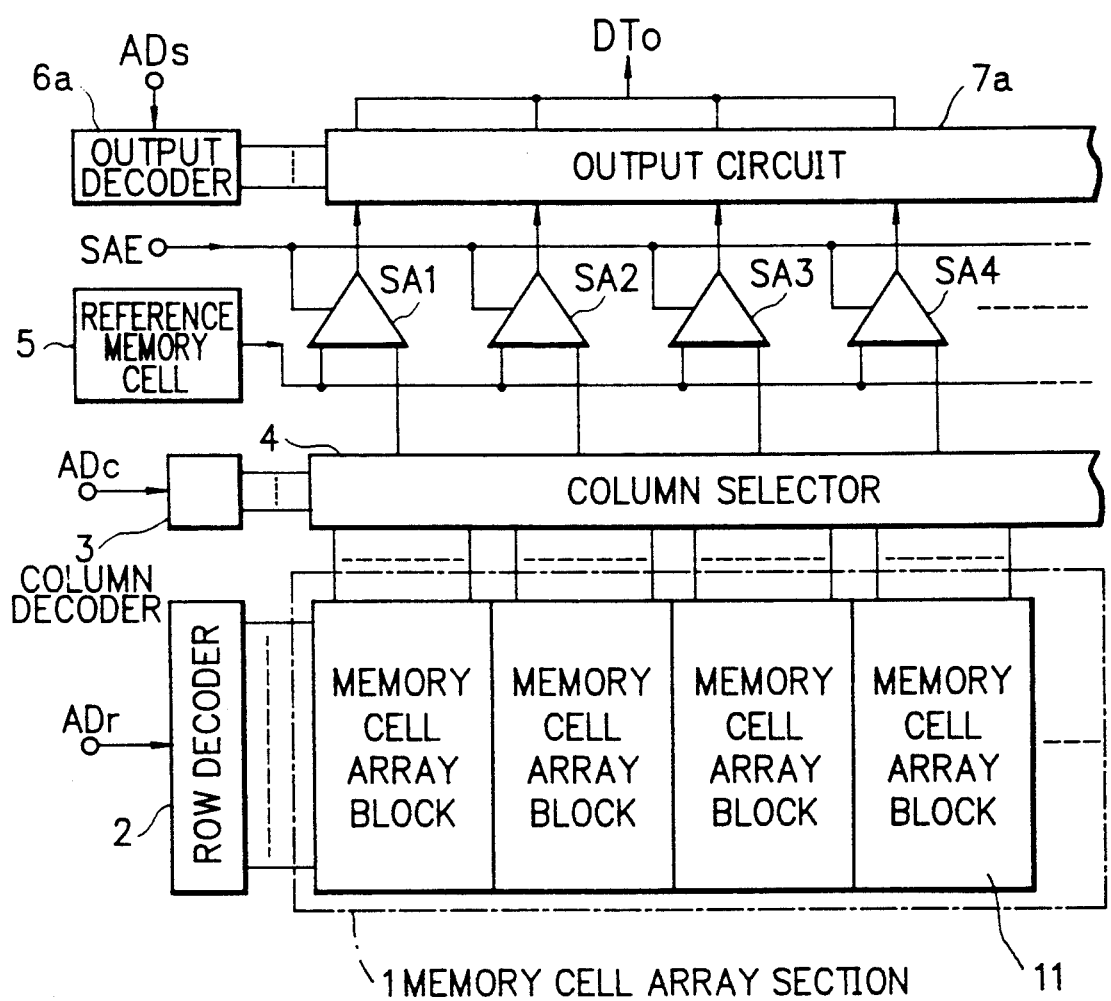
FIG. 1 is a block diagram of a conventional semiconductor memory device.
Figure 2:
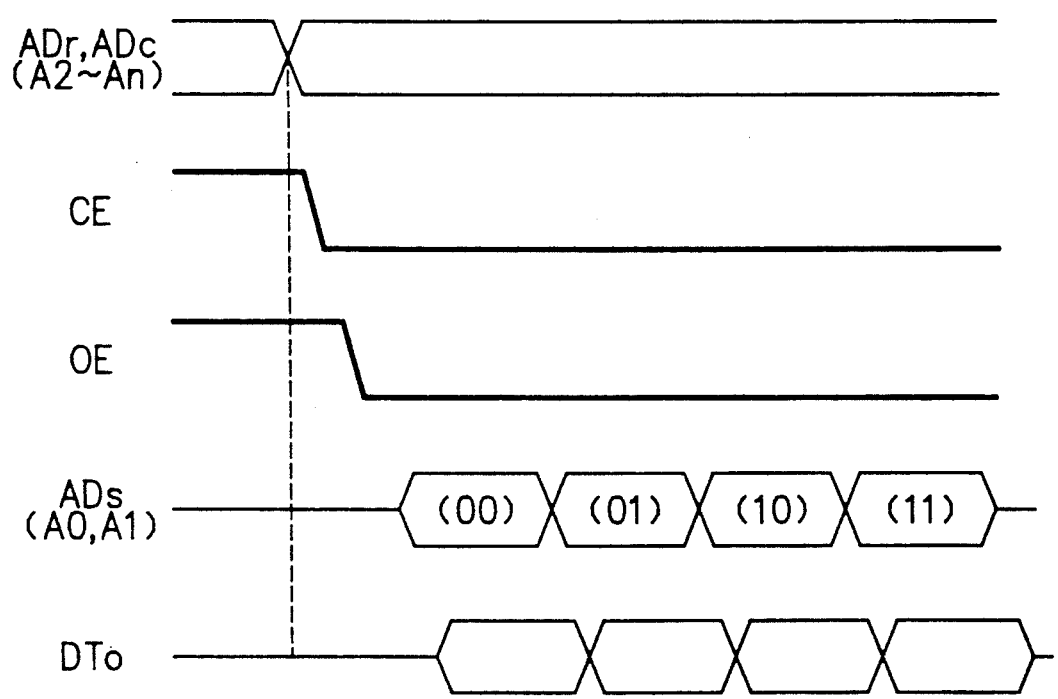
FIG. 2 is a schematic view showing waveforms of signals for explaining a page mode operation of the conventional semiconductor memory device shown in FIG. 1.
Figure 3:
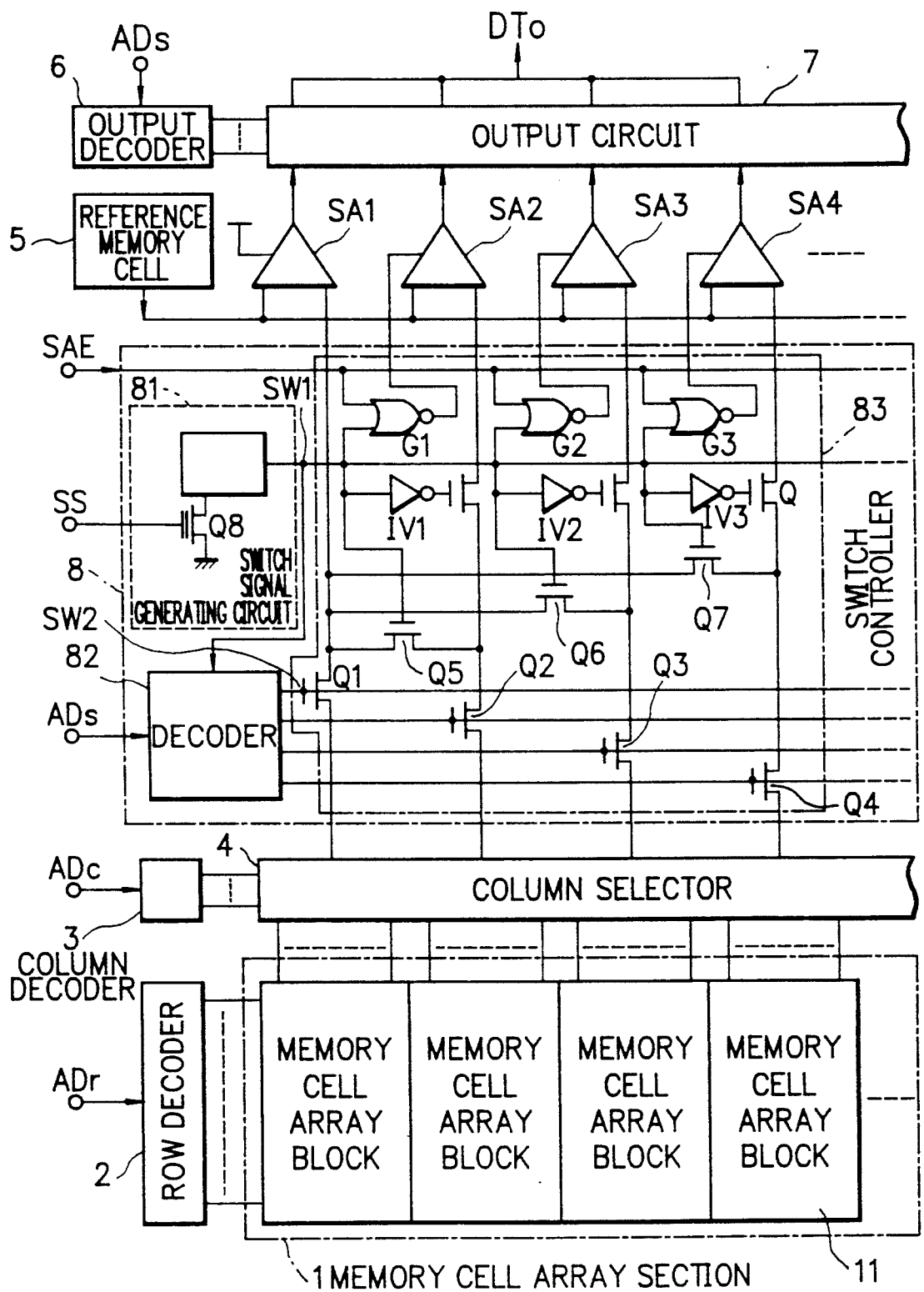
FIG. 3 is a semiconductor memory device according to the present invention.

Referring now to the accompanying drawings, wherein the similar parts to those described above in connection with the conventional embodiment shown in FIG. 1 are designated by similar or corresponding reference characters and thus the repeated description thereof can be omitted for brevity, there is shown in FIG. 3 one embodiment of a semiconductor memory device according to the present invention.

As shown in FIG. 3, the semiconductor memory device is comprised of a memory cell array section 1 having a plurality of memory cell array blocks 11 (in this case, four memory cell array blocks 11), a row decoder 2 connected to the memory cell array section 1, a column selector 4 connected to the memory cell array section 1, a column decoder 3 coupled with the column selector 4, a reference memory cell 5 for storing reference data, a plurality of sense amplifiers SA1, SA2, SA3 and SA4 (in this case, four sense amplifiers corresponding to the memory cell array blocks 11) connected to the reference memory cell 5 and the column selector 4 via a switch circuit 8, an output circuit 7 connected to the sense amplifiers SA1, SA2, SA3 and SA4, and an output decoder 6 coupled with the output circuit 7.

The switch circuit 8 includes a switch signal generating circuit 81 having a memory transistor Q8 for generating a first switch signal SW1 having levels corresponding to a normal mode and a page mode in response to a write state and a non-write state of the memory transistor Q8; a decoder 82 for successively making active levels of a second switch signal SW2 corresponding to the plurality of memory cell array blocks 11 according to the selection address signal ADs when the first switch signal SW1 has a normal mode level; and a switch controller 83 for controlling a switching of the connection between the memory cell array blocks 11 and the sense amplifiers SA1, SA2, SA3 and SA4 via the column selector 4 according to the first and second switch signals SW1 and SW2 and the sense activation signal SAE and controlling both an activation and an inactivation of the sense amplifiers SA1, SA2, SA3 and SA4, the switch controller 83 having a plurality of transistors Q1 to Q7, a plurality of inverters IV1 to IV3 and a plurality of NOR gates G1 to G3.

That is, in the normal mode, the switch controller 83 activates one (SA1) of the sense amplifiers SA1, SA2, SA3 and SA4 (in FIG. 3, the sense amplifier SA1 is always activated) and successively transfers the data read out of the memory cell array blocks 11 to the one activated sense amplifier SA1 according to the selection address signal ADs. On the other hand, in the page mode, the switch controller 83 activates all the sense amplifiers SA1, SA2, SA3 and SA4 and transfers the data read out of the memory cell array blocks 11 to the corresponding sense amplifiers SA1, SA2, SA3 and SA4. Further, by using the output decoder 6 and the output circuit 7, in the normal mode, the data output from the one activated sense amplifier SA1 are output from the output circuit 7, and in turn, in the page mode, the data output from the plurality of sense amplifiers SA1, SA2, SA3 and SA4 are consecutively output from the output circuit 7 according to the selection address signal ADs.

In this embodiment, the memory transistor Q8 may be writable only one time or both writable and erasable a plurality of times.

In the semiconductor memory device according to the present invention, in the normal mode, the number of the sense amplifiers to be activated is only one and hence a waste of a consumption power can be eliminated.

As described above, according to the present invention, in the normal mode, the minimum number of the sense amplifiers can be activated and the waste for the consumption power can be removed.

While the present invention has been described with reference to the particular illustrative embodiment, it is not to be restricted by those embodiment but only by the appended claims. It is to be appreciated that those skilled in the art can change or modify the embodiment without departing from the scope and spirit of the present invention.

What is claimed is:

1. A semiconductor memory device, comprising:
   memory cell array means having a plurality of memory cell array blocks to be read out data from addresses selected by a first address signal;
   a plurality of sense amplifiers corresponding to the memory cell array blocks, the sense amplifiers detecting levels of data transferred from the memory cell array blocks when the sense amplifiers are activated, to output the detected levels;
   a switch circuit for activating one of the sense amplifiers and successively transferring the data read out of the memory cell array blocks to the one activated sense amplifier according to a second address signal in a normal mode and for activating all the sense amplifiers and transferring the data read out of the memory cell array blocks to the corresponding sense amplifiers in a page mode; and
   an output circuit for outputting the data of the one activated sense amplifier in the normal mode and successively outputting the data of the plurality of sense amplifiers according to the second address signal in the page mode.

2. The semiconductor memory device as claimed in claim 1, wherein the switch circuit includes:
   a switch signal generating circuit having a memory transistor for generating a first switch signal having levels corresponding to the normal mode and the page mode in response to a write state and a non-write state of the memory transistor;
   a decoder for successively making active levels of a second switch signal corresponding to the plurality of memory cell array blocks according to the second address signal when the first switch signal has a normal mode level; and
   a switch controller for controlling a switching of the connection between the memory cell array blocks and the sense amplifiers according to the first and second switch signals and controlling an activation and an inactivation of the sense amplifiers.

3. The semiconductor memory device as claimed in claim 2, wherein the write state and the non-write state of the memory transistor is controlled from outside.

* * * * *